(12) United States Patent
Suzuki et al.

(10) Patent No.: US 8,008,671 B2
(45) Date of Patent: Aug. 30, 2011

(54) LIGHT-EMITTING DEVICE AND METHOD FOR FABRICATING THE SAME

(75) Inventors: Yukari Suzuki, Annaka (JP); Jun Ikeda, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 136 days.

(21) Appl. No.: 12/524,118

(22) PCT Filed: Jan. 28, 2008

(86) PCT No.: PCT/JP2008/051201
§ 371 (c)(1),
(2), (4) Date: Jul. 22, 2009

(87) PCT Pub. No.: WO2008/091010
PCT Pub. Date: Jul. 31, 2008

(65) Prior Publication Data
US 2010/0032688 A1    Feb. 11, 2010

(30) Foreign Application Priority Data
Jan. 26, 2007  (JP) ................................ 2007-016690

(51) Int. Cl.
*H01L 27/15* (2006.01)

(52) U.S. Cl. .......................................... 257/79; 257/94

(58) Field of Classification Search ................ 257/79
See application file for complete search history.

(56) References Cited

U.S. PATENT DOCUMENTS

| 6,465,809 B1 * | 10/2002 | Furukawa et al. ............. 257/94 |
| 2006/0202219 A1 | 9/2006 | Ohashi et al. |
| 2007/0145883 A1 | 6/2007 | Ohashi et al. |

FOREIGN PATENT DOCUMENTS

| JP | 2001-057441 A | 2/2001 |
| JP | 2002-334816 A | 11/2002 |
| JP | 2005-259912 A | 9/2005 |
| JP | 2006-253298 A | 9/2006 |

* cited by examiner

*Primary Examiner* — Bradley K Smith
*Assistant Examiner* — Tony Tran
(74) *Attorney, Agent, or Firm* — Arent Fox LLP (57) ABSTRACT

A transparent conductive semiconductor substrate 70 comprising a light emitting layer section 24 is directly bonded on one of main surfaces on a main compound semiconductor layer 50 composed of Group III-V compound semiconductor, wherein an alkali metal atom concentration on a bonded boundary surface between the main compound semiconductor layer 50 and the transparent conductive semiconductor substrate 70 is adjusted to be equal to or greater than $1\times10^{14}$ atoms/cm$^2$ and equal to or less than $2\times10^{15}$ atoms/cm$^2$. Herewith, it provides a light emitting device capable of sufficiently decreasing boundary surface resistance between the light emitting layer section and the transparent conductive semiconductor substrate.

2 Claims, 7 Drawing Sheets

LIGHT-EMITTING DEVICE AND METHOD FOR FABRICATING THE SAME

RELATED APPLICATIONS

This application is a National Stage entry of International Application No. PCT/JP2008/051201, filed Jan. 28, 2008, and claims the priority of Japanese Patent Application No. 2007-016690 filed on Jan. 26, 2007. The disclosure of the prior application is hereby incorporated herein in the entirety by reference.

BACKGROUND OF THE INVENTION

1. Field of the Invention

This invention relates to a light emitting device and a method for fabricating the same.

2. Description of the Related Art

[Patent Document 1] Japanese Laid-Open Patent Publication No. 2001-57441

[Patent Document 1] Japanese Laid-Open Patent Publication No. 2002-334816

A light emitting device having a light emitting layer section formed of an $(Al_xGa_{1-x})_yIn_{1-y}P$ alloy (where, $0 \leq x \leq 1$, $0 \leq y \leq 1$; simply referred to as AlGaInP alloy, or more simply as AlGaInP, hereinafter) can be realized as a high-luminance device, by adopting a double heterostructure in which a thin AlGaInP active layer is sandwiched between an n-type AlGaInP cladding layer and a p-type AlGaInP cladding layer, both having a larger band gap than the active layer.

In a case of an AlGaInP light emitting device, a GaAs substrate is used as a growth substrate of the light emitting layer section, however GaAs absorbs light greatly in a light emitting wavelength range of the AlGaInP light emitting layer section. Thus, Patent Document 1 and Patent Document 2 disclose a method of separating the GaAs substrate first and then newly bonding a GaP substrate which is a transparent conductive semiconductor substrate (Hereinafter, a light emitting device fabricated by this method is referred to a "direct bonding type light emitting device").

SUMMARY OF THE INVENTION

For a direct bonding type light emitting device explained above, a native oxide film generally having thickness of about 1.5 to 2 nm is formed on a surface of the transparent conductive semiconductor substrate being used therefor such as a GaP substrate or the like, and it is a cause of increase of electric resistance at a bonding boundary surface between a light emitting layer section and a transparent conductive semiconductor substrate. Accordingly, it is one of the significant problems to decrease boundary surface resistance regarding fabricating the direct bonding type light emitting device, and for example as a method of decreasing boundary surface resistance, a technique of conducting annealing after bonding is disclosed in Patent Document 1 and Patent Document 2. However, in a view of maintaining a doping profile of the light emitting layer section, the annealing temperature is not allowed to be that high, and thus there is a certain limit for decreasing the boundary surface resistance caused by the native oxide film.

Also, cleaning the pre-bonded transparent conductive semiconductor substrate is important in a view of decreasing the boundary surface resistance. Patent Document 2 discloses a technique of spin-drying the cleaned transparent conductive semiconductor substrate, however in a case that the transparent conductive semiconductor substrate is thin, or in a case that it has warp occurred, there are problems such that cracks or the like could occur easily when the substrate is spin-dried.

Further, it has been revealed that not only it increases serial resistance of the light emitting device obtained by bonding, but it lacks in stability such that the serial resistance with continuous conduction over time decreases easily. In a case that the serial resistance does not decrease to a stable level for a short time, when activating the light emitting device to control light with high speed switching (such as PWM control, or the like), there are problems influencing the switching response significantly.

A problem of this invention is to provide a light emitting device and a method for fabricating the same, achieving full decrease of boundary surface resistance between the light emitting layer section and the transparent conductive semiconductor substrate and improvement of the switching response.

Means of Solving the Problems and Advantageous Effects of the Invention

In order to solve the above problem, the light emitting device of this invention comprises a configuration having a transparent conductive semiconductor substrate directly bonded on one of main surfaces on a main compound semiconductor layer composed of Group III-V compound semiconductor, wherein an alkali metal atom concentration on a bonded boundary surface between the main compound semiconductor layer and the transparent conductive semiconductor substrate is adjusted to be equal to or greater than $1 \times 10^{14}$ atoms/cm$^2$ and equal to or less than $2 \times 10^{15}$ atoms/cm$^2$.

Regarding the light emitting device having the configuration which the transparent conductive semiconductor substrate is bonded on the main compound semiconductor layer including a light emitting layer section, decrease of boundary surface resistance of the light emitting device can be achieved by having alkali metal atoms in the above concentration range on the bonded boundary surface. Also, regarding a bonding type light emitting device as the above, forward voltage when activated for emitting light has relatively significant transient property which is considered to be derived from parasitic capacity components on the bonded boundary surface. Specifically, when forward voltage just after starting conduction is defined as an initial value Vf0, the forward voltage decreases by continuous conduction over time and settles to a stable value Vf. When this decrease value of the forward voltage to the stable value Vf, opposed to the initial value Vf0, is defined as a stabilization voltage drop, $\Delta Vf$ (that is $\Delta Vf \equiv Vf0-Vf$), this stabilization voltage drop $\Delta Vf$ can decrease greatly by having alkali metal atoms in the above concentration range on the bonded boundary surface A light emitting device having small stabilization voltage drop $\Delta Vf$ has advantages of improving the switching response significantly, when applied for such as activating to control light by high speed switching or the like. Also, after staring conduction, forward voltages at the both ends of the device are stabilized in a short time, in a case of activating for emitting light having a constant activating source voltage, linearity and stability of the light emitting luminance characteristics can increase according to an activating duty ratio.

When the alkali metal atom concentration at the bonded boundary surface between the main compound semiconductor layer and the transparent conductive semiconductor substrate is less than $1 \times 10^{14}$ atoms/cm$^2$, decreasing effects of the boundary surface resistance of the light emitting device and decreasing effects of the stabilization voltage drop $\Delta Vf$ are not significant, and variation between batches and inside the wafer surface increase, so as to cause decrease of the yield. Also, the alkali metal atom concentration at the bonded boundary surface exceeds $2\times10^{15}$ atoms/cm$^2$, the effects are saturated, and there will be more unnecessity of the step to have alkali metal atoms on the bonded boundary surface at a high concentration. The alkali metal atom concentration on the bonded boundary surface is preferably equal to or greater than $3\times10^{14}$ atoms/cm$^2$ and equal to or less than $1.5\times10^{15}$ atoms/cm$^2$.

A method for fabricating the light emitting device of this invention, in order to fabricate the above light emitting device of this invention, comprises a main compound semiconductor layer growth step of growing the main compound semiconductor layer epitaxially on a first main surface of a growth substrate, a step of removing the growth substrate from the main compound semiconductor layer, a native oxide film removing step of removing a native oxide film formed on a bonded surface of the transparent conductive semiconductor substrate to the main compound semiconductor layer, an organic solvent contacting step of contacting the bonded surface of the transparent conductive semiconductor substrate having the native oxide film removed with organic solvent including alkali, a bonding step of overlapping and bonding the bonded surface of the transparent conductive semiconductor substrate to a bonded surface of the main compound semiconductor surface.

Prior to bonding the transparent conductive semiconductor substrate to the main compound semiconductor layer including the light emitting layer section, it is required to remove the native oxide film formed on the surface of the transparent conductive semiconductor substrate (Regarding "removal of the native oxide film" here, it is acceptable as long as at least some part of the native oxide film is removed so as to decrease its thickness, and it does not necessarily means to remove it completely). However, when the transparent conductive semiconductor substrate after removal of the native oxide film is left in air, the native oxide film grows again for a relatively short time, so as to deteriorate effects of decreasing the boundary surface resistance. Therefore, the organic solvent contacting step of contacting the surface of the transparent conductive semiconductor substrate after removing the native oxide film with organic solvent is conducted. This suppresses re-growth of the native oxide film, so as to contribute decrease of the boundary surface resistance and the stabilization voltage drop $\Delta Vf$. Also, by having organic solvent including alkali as this organic solvent, alkali metal components derived from the organic solvent including alkali stays on the bonded surface within the above concentration range, so that decreasing effects of the boundary surface resistance and the stabilization voltage drop $\Delta Vf$ would be even more significant In this case, on the bonded boundary surface, total thickness of the oxide films formed on the main compound semiconductor layer side and the transparent conductive semiconductor substrate side is desirably equal to or less than 1.3 nm, and more desirably equal to or less than 0.8 nm.

Regarding the method for fabricating a light emitting device of this invention, the native oxide film removing step is an alkali cleaning step, after the alkali cleaning step, a water cleaning step of the transparent conductive semiconductor substrate is conducted, and then the organic solvent contacting step is implemented by immersing the bonded surface of the transparent conductive semiconductor substrate in the organic solvent including alkali after the water cleaning step and then conducting drying.

More specifically, the native oxide film removing step removes the native oxide film quickly, for example, by the alkali cleaning step using an alkali etching solution such as potassium hydroxide solution, the sodium hydroxide solution or the like. In this case, the alkali metal atoms provided on the bonded boundary surface are potassium atoms for the former, and sodium atoms for the later.

When removal of the native oxide film is conducted by wet etching as described above, a washing step and a drying step are obviously required after the etching. In this case, after washing with water, the above organic solvent contacting step is conducted immediately so as to replace the water to the organic solvent, and then dried, so as that the growth speed of the native oxide film decreases greatly after drying, so as to contribute to decease of the boundary surface resistance. Also, a storing interval after removing the native oxide film till bonding the transparent conductive semiconductor substrate to the main compound semiconductor layer can be ensured relatively long, so as to also contribute improvement of productivity of the direct contact type light emitting device.

In this case, it is more desirable to use organic solvent including alkali, which includes alkali components at a higher concentration than that brought from the washing solution per application of the washing step after the water washing step (that is to use organic solvent including alkali, which has alkali components added aggressively more than the amount brought into from the washing step), in order to increase the alkali metal atom concentration on the bonded boundary surface to the above mentioned range.

It is desirable to use organic solvent used for the organic solvent contacting step, which can be mixed with water freely, so as to proceed replacement of the water left on the bounded surface after washing with water (for example, alcohol, ketone type or the like). Also, in order to effectively evaporate the water with the organic solvent by azeotropy, it is desirable to use organic solvent which can mix with water freely and also having vapor pressure differential of equal to or less than 100 hPa to water at 20° C. As these organic solvents, specifically alcohol, such as isopropanol (boiling point: 82.4° C., vapor pressure differential to water at 20° C.: 20 hPa), ethanol (boiling point: 78.3° C., vapor pressure differential to water at 20° C.: 36 hPa) or the like can be used suitably. Also, alcohol is advantageous in a view that it can easily dissolve alkali metal hydroxide, and easily prepare organic solvent including alkali (that is, the organic solvent including alkali can be alcohol having alkali metal hydroxide dissolved).

In this case, it is more desirable that the organic solvent including alkali includes water as well as alkali metal hydroxide, in order to increase the alkali metal atom concentration on the bonded boundary surface to the above stated range.

As alcohol used, isopropanol is especially effective for this invention, because it has great effects of suppressing re-growth of the native oxide film after drying. Also, as alkali metal hydroxide added to the organic solvent including alkali, it is desirable to use potassium hydroxide or sodium hydroxide.

In this case, it is desirable to use organic solvent including alkali having potassium hydroxide or sodium hydroxide (they both may be added, and in that case its total) in a range equal to or greater than $5\times10^{-6}$ mol/L and equal to or less than $3\times10^{-4}$ mol/L. When the alkali inclusion is less than $5\times10^{-6}$ mol/L, its effects of decrease of the boundary surface resistance is not sufficient, and when it is more than $3\times10^{-4}$ mol/L, agglomeration of the alkali components or the like occurs, and the organic solvent including alkali sometimes becomes unstable, so as not be able to conduct uniform treatment. The alkali inclusion is more desirably equal to or greater than $1 \times 10^{-5}$ mol/L and equal to or less than $3 \times 10^{-4}$ mol/L. Also, the organic solvent including alkali desirably includes water in a range of equal to or greater than $1 \times 10^{-4}$ mol/L and equal to or less than 5 mol/L. When the water inclusion is less than $1 \times 10^{-4}$ mol/L, it is difficult to increase the alkali metal atom concentration on the bonded boundary surface to the above stated range. Also, when it exceeds 5 mol/L, water tends to easily stay on the bonded surface, and the native oxide film re-grows, so as to lead to deteriorate decreasing effects of the boundary surface resistance and the decreasing effects of the stabilization voltage drop $\Delta Vf$ conversely. The above stated water inclusion range is more desirably equal to or greater than 0.05 mol/L and equal to or less than 5 mol/L.

The above stated organic solvent contacting step (or the native oxide film removing step by alkali cleaning and the water washing step, and the following organic solvent contacting step) can be implemented similarly to the bonded surface of the main compound semiconductor layer, so as to contribute further to decrease of the boundary surface resistance and the stabilization voltage drop $\Delta Vf$.

BEST MODES FOR CARRYING OUT THE INVENTION

Figure 1:
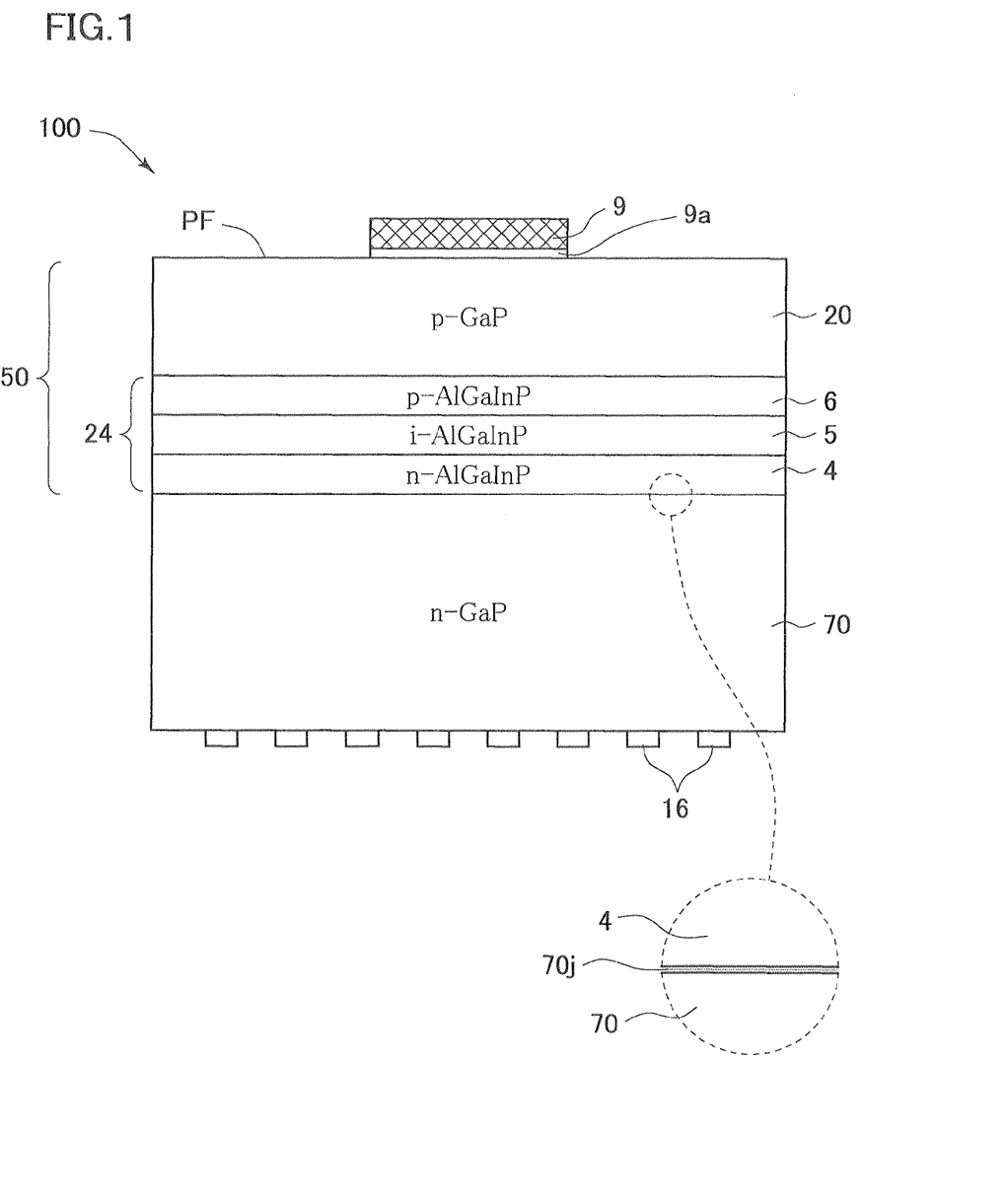
FIG. 1 is a schematic drawing showing an example of a light emitting device subject to application of this invention.

Hereinafter, embodiments of a method for fabricating a light emitting device related to this invention will be explained, referring to the attached drawings. FIG. 1 is a conceptual drawing showing a light emitting device subject to application of this invention. A light emitting device 100 has a structure in which a light emitting layer section 24 is directly bonded on a first main surface of a GaP substrate 70 as a transparent conductive semiconductor substrate (It is n-type in this embodiment, however when a stack order of each layer of a main compound semiconductor layer 50 is p/n reverse of the above, it is p-type: Also, other transparent conductive semiconductor substrates such as GaAsP, AlGaAs or the like may be used). Regarding this embodiment, main surfaces of each layer and the substrate, as shown in FIG. 1, have a right position state of having a light extraction surface PF of the light emitting device 100 on the upper side, and in this right position state it is stated uniformly surfaces on the upper side of the drawings as first main surfaces, and surfaces on the downside of the drawings as second main surfaces. Accordingly, for sake of convenience of step explanation, when it is illustrated in a reverse position state upside down to the above right position state in a drawing, a relationship between up and down of the first main surface and the second main surface reverses regarding the drawing illustrated.

The light emitting layer section 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between a p-type cladding layer 6 composed of a p-type $(Al_zGa_{1-z})_yIn_{1-y}P$ alloy (where, $x<z \leq 1$), and an n-type cladding layer 4 composed of an n-type $(Al_zGa_{1-z})_yIn_{1-y}P$ alloy (where, $x<z \leq 1$), and according to composition of the active layer 5, the light emitting wavelength can be controlled within a green to red spectrum (The light emitting wavelength (peak light emitting wavelength) is equal to or greater than 550 nm and equal to or less than 670 nm). Additionally, the light emitting layer section 24 may be composed of $In_xGa_yAl_{1-x-y}N$ ($0 \leq x \leq 1$, $0 \leq y \leq 1$, $x+y \leq 1$)

A GaP current spreading layer 20 is formed on the first main surface of the light emitting layer portion 24, and configures the main compound semiconductor layer 50 with the light emitting layer portion 24. On approximate center of a first main surface of the current spreading layer 20, a light extraction surface side electrode 9 (for example, an Au electrode) is formed to apply light emitting activating voltage to the light emitting layer section 24. Between the light extraction surface side electrode 9 and the GaP current spreading layer 20, an AuBe alloyed contact layer 9a (for example, Be: 2 mass %) is disposed as a light extraction side alloyed contact layer. Further, a peripheral region of the light extraction surface side electrode 9 on the first main surface of the current spreading layer 20 forms a light extraction region PF from the light emitting layer section 24. Also, this embodiment has a stack configuration having the p-type cladding layer 6 positioned on the light extraction layer side, however it may have a stack configuration having the n-type cladding layer 4 positioned on the light extraction surface side (in this case, the current spreading layer 20 needs to be n-type, and also the alloyed contact layer 9a is composed of AuGeNi or the like).

Thickness of the n-type cladding layer 4 and the p-type cladding layer 6 is respectively, for example, equal to or greater than 0.8 μm and equal to or less than 4 μm (desirably equal to or greater than 0.8 μm and equal to or less than 2 μm) and thickness of the active layer 5 is respectively, for example, equal to or greater than 0.4 μm and equal to or less than 2 μm (desirably equal to or greater than 0.4 μm and equal to or less than 1 μm). Total thickness of the light emitting layer section 24 is, for example, equal to or greater than 2 μm and equal to or less than 10 μm (desirably equal to or greater than 2 μm and equal to or less than 5 μm). Further, thickness of the GaP current spreading layer 20 is, for example, equal to or greater than 5 μm and equal to or less than 200 μm (desirably equal to or greater than 5 μm and equal to or less than 28 μm, more desirably equal to or greater than 8 μm and equal to or less than 15 μm). Accordingly, thickness of the main compound semiconductor layer 50 is, for example, equal to or greater than 7 μm and equal to or less than 210 μm (desirably equal to or greater than 7 μm and equal to or less than 38 μm, more desirably equal to or greater than 10 μm and equal to or less than 20 μm).

The GaP substrate 70 is fabricated by slicing and polishing GaP single crystal ingot, and its thickness is, for example, equal to or greater than 50 μm and equal to or less than 500 μm. Additionally, as a GaP substrate, a GaP epitaxial wafer, which has a single crystal layer epitaxially grown of GaP or InGaP on the main surface on the bonded surface side to the main compound semiconductor layer 50 of a single crystal substrate fabricated by slicing and polishing GaP single crystal ingot, can be used (In this case when a substrate of the InGaP layer grown epitaxially is used, if the InGaP layer is smaller in thickness than the GaP single crystal substrate, the epitaxial wafer is considered broadly to belong to concept as a GaP substrate). On a back surface of the GaP substrate 70, an AuGeNi alloyed contact layer 16 (for example, Ge: 15 mass %, Ni: 10 mass %) is formed dispersively as a substrate side alloyed contact layer. The alloyed contact layer 16 is, for example, adhered to an unillustrated metal stage with, for example, an Ag paste layer or the like.

A boundary surface between the GaP substrate 70 and the main compound semiconductor layer 50 is a bonded boundary surface, alkali metal atom concentration on the bonded boundary surface is controlled to be equal to or greater than $1 \times 10^{14}$ atoms/cm$^2$ and equal to or less than $2 \times 10^{15}$ atoms/cm$^2$ (desirably equal to or greater than $3 \times 10^{14}$ atoms/cm$^2$ and equal to or less than $1.5 \times 10^{15}$ atoms/cm$^2$). The alkali metal atoms are potassium atoms in this embodiment, however may be sodium atoms, or may be mixture of potassium atoms and sodium atoms.

Figure 4:
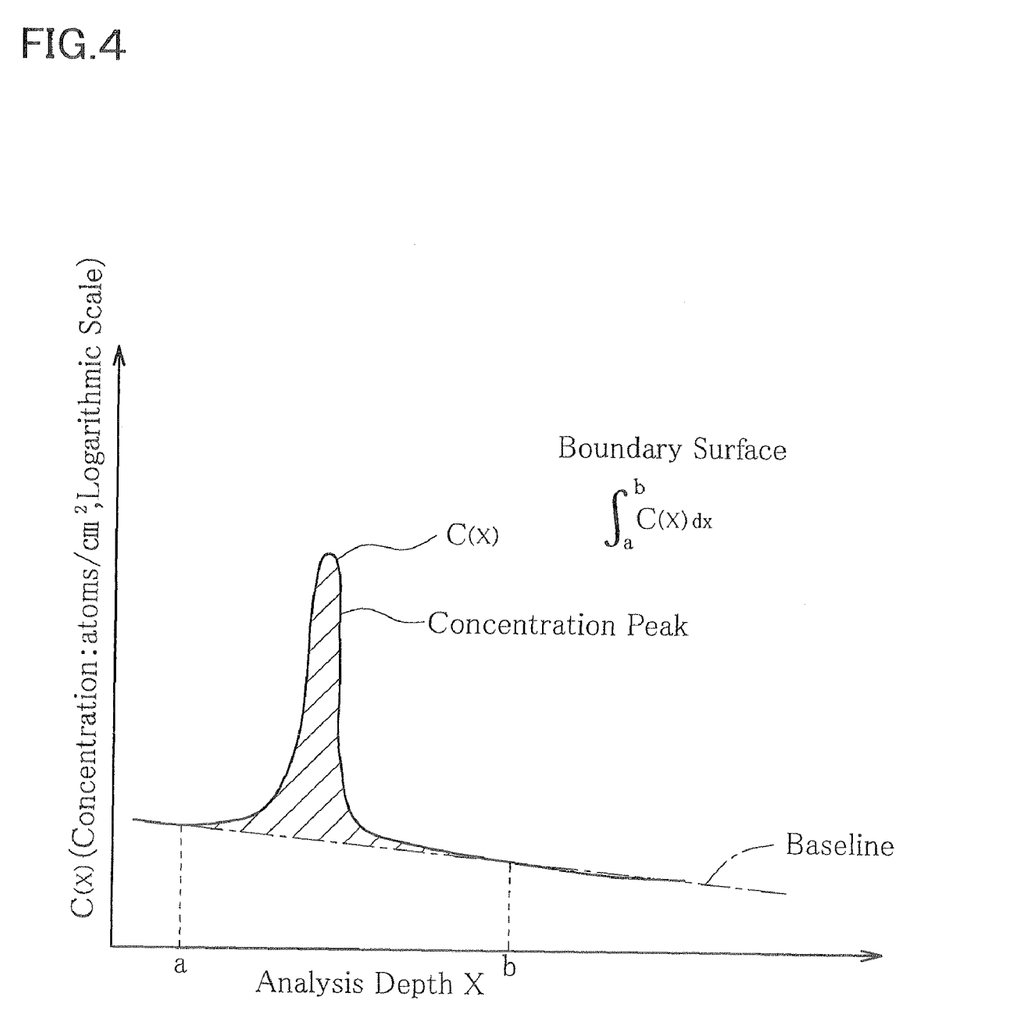
FIG. 4 is an explanatory drawing related to a method of calculating the boundary surface alkali atom concentration.

This "alkali metal atom concentration on the boundary surface" can be measured, as follows. That is, the current spreading layer 7 is examined by SIMS analysis, from the first main surface side or the second main surface side in a depth direction (x), and, as shown in FIG. 4, a depth direction concentration profile C (x), which shows an alkali metal atom concentration per unit volume at each depth position, is measured. Additionally, the SIMS analysis in a depth direction is conducted by D-SIMS (Dynamic SIMS) of conducting secondary ion mass spectrometry while using irradiating primary ion beam also as etching beam in a depth direction of a sample surface. A value of integrating this concentration profile in a depth direction C (x) by a depth direction distance (x) at an interval including the alkali metal atom concentration peak position corresponding to the above boundary surface is employed as the boundary surface alkali metal atom concentration. The profile in a depth direction C (x) decreases rapidly while distanced from the boundary surface position (the concentration peak position), so as to form a baseline which shows a background alkali metal atom concentration. A rising position to the peak from this baseline may be defined as a boundary of interval of integration, however the alkali metal atom concentration at the baseline is usually lower by several digits than the alkali metal atom concentration at the peak position, therefore the interval of integration may be set broadly to exceed the above rising position outwardly from the peak, and it hardly influences a calculated value of the boundary surface alkali metal atom concentration.

Returned to FIG. 1, an oxide film 70j is formed on a bonded boundary surface of the GaP substrate 70 and the main compound semiconductor layer 50. This oxide film 70j derives from native oxide films respectively formed on bonding boundary surfaces of the GaP substrate 70 and the main compound semiconductor substrate 50 on the bonding stage, and its thickness is equal to or less than 1.3 nm (desirably equal to or less than 0.8 nm). Thickness of the oxide film 70j can be measured by using, for example, spectroscopic ellipsometry.

Hereinafter, a specific example of a method for fabricating the above light emitting device 100 will be explained.

Figure 2:
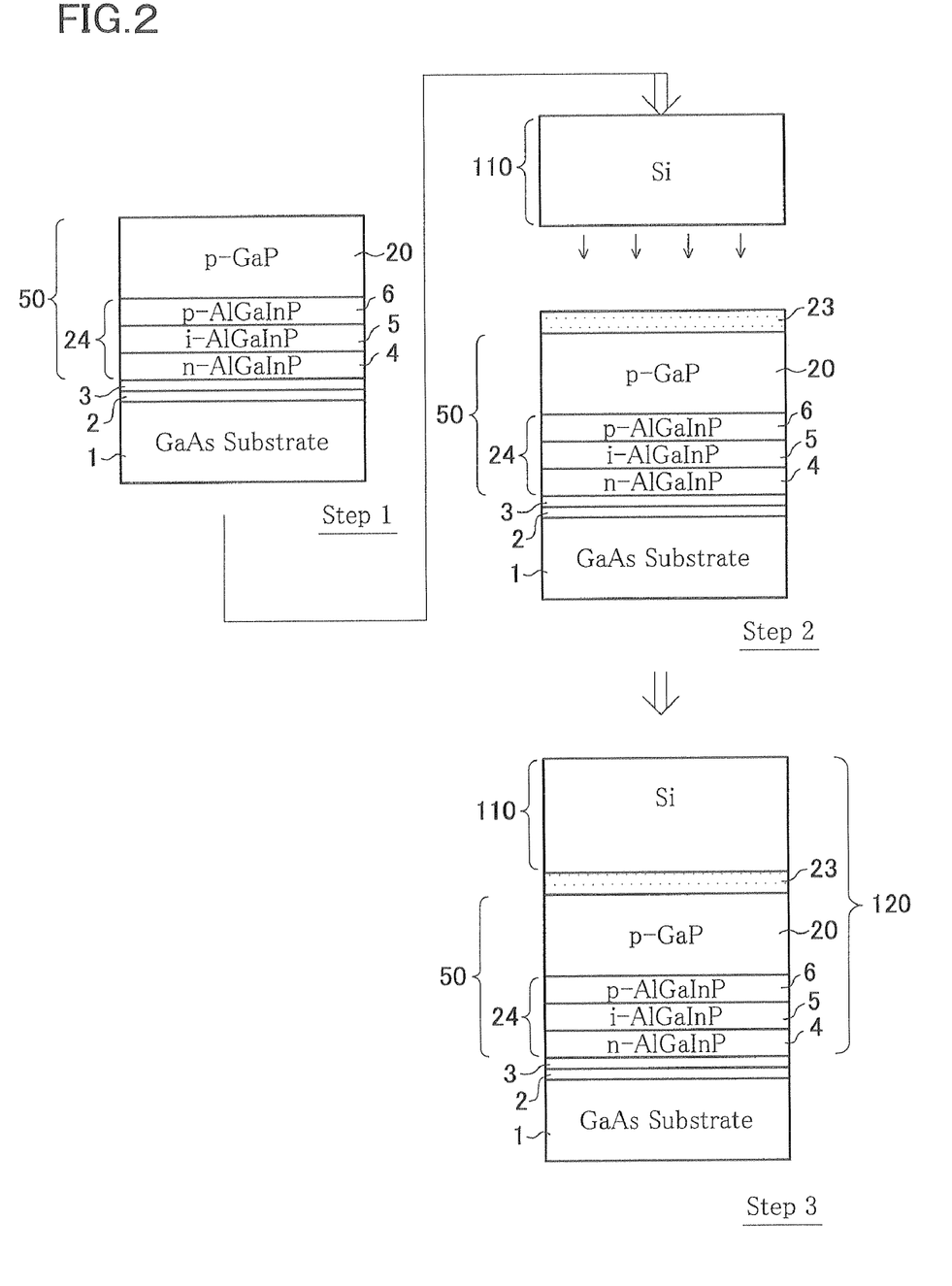
FIG. 2 is a step explanatory drawing showing a method for fabricating the light emitting device related to this invention.

First, As shown in Step 1 of FIG. 2, on a main surface of a GaAs single crystal substrate 1 composing the GaAs substrate, an n-type GaAs buffer layer 2, having thickness of, for example, 0.5 μm and a separation layer composed of AlAs having thickness of, for example, 0.5 μm are grown epitaxially in this order. Subsequently, as the light emitting layer section 24, an n-type cladding layer 4 (thickness: for example, 1 μm), an AlGaInP active layer (non-doped) 5 (thickness: for example, 0.6 μm) and a p-type cladding layer 6 (thickness: for example, 1 μm) are epitaxially grown in this order. Total thickness of the light emitting layer section 24 is 2.6 μm. Also, a current spreading layer 20 composed of p-type GaP is further grown epitaxially so as to have thickness of 17 μm. The above epitaxial growth of each layer can be conducted by a publicly known MOVPE method. Herewith, a main compound semiconductor layer 50, comprising the light emitting layer section 24 and the GaP current spreading layer 20, is formed on the GaAs single crystal substrate 1.

Next, as shown in Step. 2, an adhesive layer 23 composed of wax or the like is formed on a first main surface of the main compound semiconductor layer 50, and as shown in Step 3, a temporary supporting bonded member 120 is configured by bonding a temporary supporting substrate 110 composed of a Si substrate or the like. Then, as shown in Step 4 of FIG. 3, the GaAs single crystal substrate 1 as a GaAs substrate, which is attached to the temporary supporting bonded member 120, is removed. The removal is implemented by, for example, immersing the temporary supporting bonded member 120 (referred to Step 3) along with the GaAs single crystal substrate 1 in an etching solution (for example, 10% hydrofluoric acid solution) and selectively etching an AlAs separation layer 3 formed between a buffer layer 2 and the light emitting layer section 24, so as to separate the GaAs single crystal substrate 1 from the temporary supporting bonded member 120. Additionally, it's also allowed to employ a step of forming an etch stop layer composed on AlInP instead of the AlAs separation layer 3, etch-removing the GaAs single crystal substrate 1 along with the GaAs buffer layer 2 using a first etching solution (for example, ammonia/hydrogen peroxide mixed solution) having selective-etchability to GaAs, and then etch-removing the etch stop layer using a second etching solution (for example hydrochloric acid: fluorine may be added for removing an Al oxide layer) having selective-etchability to AlInP.

Figure 3:
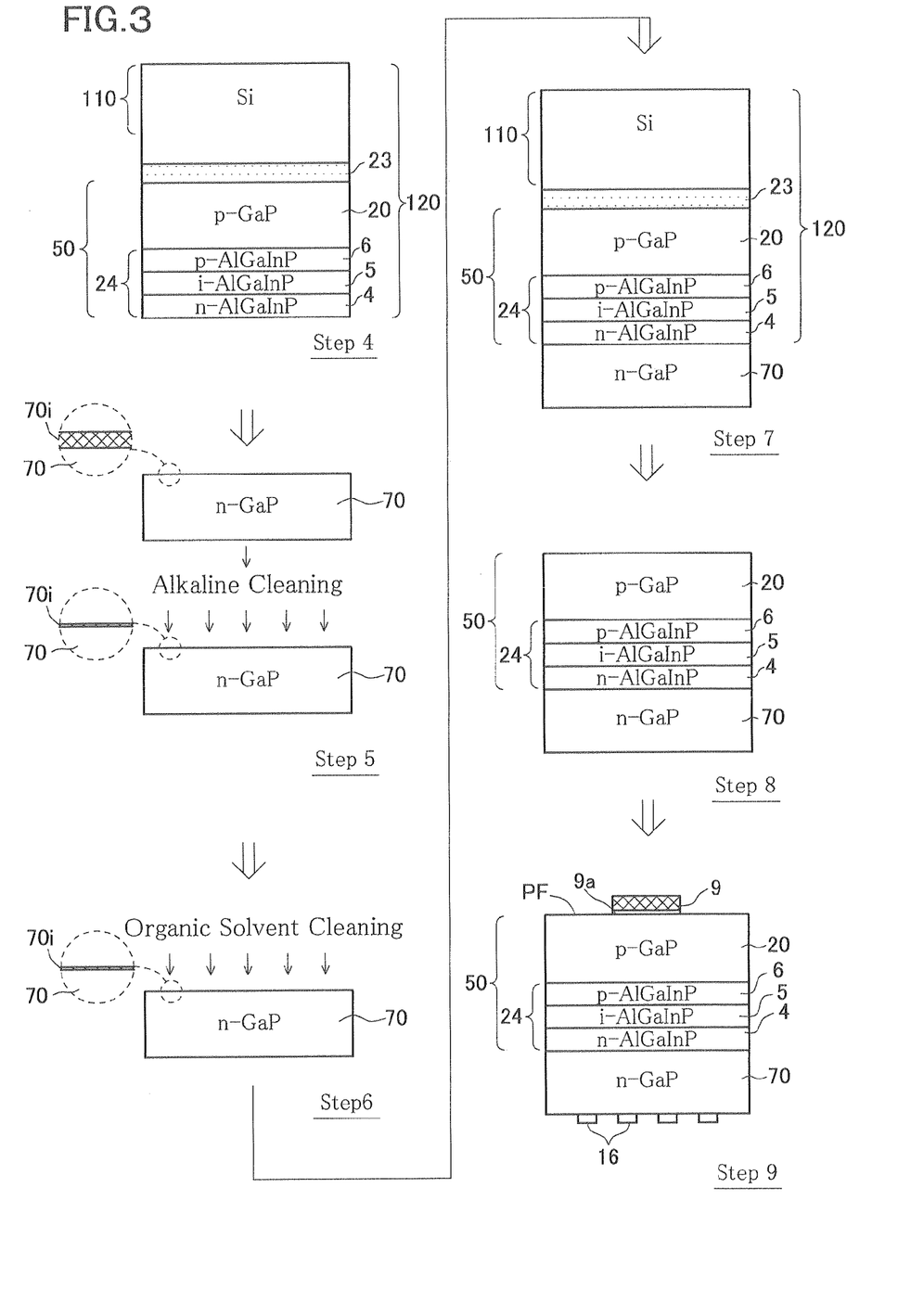
FIG. 3 is a step explanatory drawing continuous from FIG. 2.

Next, as shown in Step 5, a first main surface (bonded surface) of a separately-prepared n-type GaP substrate 70 is cleaned with an alkali etching solution composed of a sodium hydroxide solution or a potassium hydroxide solution, so as to remove a native oxide film 70i formed on the first main surface of the n-type GaP substrate 70. Specifically, the native oxide film formed to have thickness of approximately 1.5 to 2 nm decreases in thickness significantly (for example, to the thickness less than 1 nm) by this cleaning. Then, after the cleaning, the first main surface of the n-type GaP substrate 70 is further cleaned with water, next, as shown in Step 6, the first main surface is immersed in organic solvent including alkali so as to replace the water (organic solvent contacting process), and then drying is conducted. The organic solvent including alkali in use is specifically one using isopropanol as the organic solvent, including potassium hydroxide or sodium hydroxide (may be both added, and in this case its total) in a range of equal to or greater than $5 \times 10^{-6}$ mol/L and equal to or less than $3 \times 10^{-4}$ mol/L (desirably equal to or greater than $5 \times 10^{-5}$ mol/L and equal to or less than $3 \times 10^{-4}$ mol/L), and water in a range of equal to or greater than $1 \times 10^{-4}$ mol/L and equal to or less than 5 mol/L (desirably equal to or greater than 0.05 mol/L and equal to or less than 5 mol/L).

The above organic solvent including alkali may be prepared by adding a water solution, which is composed of water having potassium hydroxide or sodium hydroxide dissolved in a range of equal to or greater than 1 mass % and equal to or less than 30 mass %, to isopropanol in a range of equal to or greater than 0.01 mass % and equal to or less than 0.2%.

Additionally, the above native oxide film removal, water cleaning, organic solvent contacting process and drying is desirably conducted similarly regarding a second main surface (bonded surface) of the main compound semiconductor layer 50 exposed by implementing Step 4.

Then, as shown in Step 7, in a state of the above temporary supporting bonded member 120, a first main surface of a separately-prepared n-type GaP substrate 70 is laid over and pressed to the second main surface of the main compound semiconductor layer 50 exposed by removal of the GaAs single crystal substrate 1, and further applied with bonding annealing, rising to a range of equal to or greater than 400° C. and equal to or less than 700° C. As explained above, the first main surface of the n-type GaP substrate 70 (or the second main surface of the main compound semiconductor layer 50) having the native oxide film removed by alkali cleaning is, after water cleaning, applied with the organic solvent including alkali contacting process, and dried, so as that it is difficult for the native oxide film 70i once removed to re-grow, and thickness of the oxide film 70j on the boundary surface after bonding can remain within the above range. Further, alkali metal components derived from the organic solvent including alkali are slightly left on the bonding surface within the above concentration range. Also, even when the retention period after removing the native oxide film is long, thickness of the native oxide film can remain small, so as to increase flexibility of the process time schedule, and contribute to improvement of productivity. Additionally, the bonding surface resistance of the light emitting device obtained by bonding can remain low, so that the forward voltage Vf can be small. Also, a change value of the forward voltage after starting conduction, that is the stabilization voltage drop ΔVf is also small and stable, so as to improve its switching responsibility greatly, for example, for usages of activating to control light by high speed switching, or the like.

After completing the above bonding annealing, as shown in Step 8, the adhesive layer 23 is dissolved with organic solvent or the like, so as to separate the temporary supporting substrate 110. Next, as shown in Step 9, on the first main surface of the main compound semiconductor layer 50 exposed by separation and removal of the temporary supporting substrate 110, that is the first main surface of the GaP current spreading layer 20, an AuBe light extraction side contact metal layer is formed covering some part thereof, and further by applying alloying annealing at a temperature of equal to or greater than 300° C. and equal to or less than 500° C., so as to be an AuBe alloyed contact layer (light extraction side alloyed contact layer) 9a. Then, a light extraction side electrode 9 composed of Au or the like is formed so as to cover the AuBe alloyed contact layer 9a. Also, on a second main surface of the GaP substrate 70, an AuGeNi contact metal layer is dispersively formed by evaporation, and further by applying alloying annealing at a temperature equal to or greater than 300° C. and equal to or less than 500° C., so as to be an AuGeNi alloyed contact layer (substrate side alloyed contact layer) 16.

Hereinbefore, for sake of easier understanding, the steps are explained while illustrating a stack configuration of an individual device, in actuality, a bonded wafer having a plurality of device chips disposed in matrix formed in a lump sum is fabricated. Then, this bonded wafer is diced by a usual method to be a device chip, fixed on a supporting member, then applied with wire bonding with lead wire or the like, and then applied with resin sealing, so as to obtain the final light emitting device.

Also, a boundary surface between the GaP current spreading layer 20 and the light emitting layer section 24 can be formed as a bonding surface which satisfies the above explained conditions.

In order to determine effects of this invention, the following test was conducted. Specifically, by preparing solutions having potassium hydroxide dissolved at 22 mass % in water, and adding isopropanol so as to have various potassium hydroxide concentration on FIG. 5, the organic solvents including alkali were adjusted. Then, as shown in FIG. 3, after the native oxide film removal and the water cleaning, immersing in the above organic solvent including alkali and pull out, and then natural drying were conducted. Subsequently, K concentrations on the bonding surface of the light emitting device sample obtained by conducting the bonding step after conducting this drying were respectively measured with the above method using SIMS. The results are shown on FIG. 5.

Figure 5:
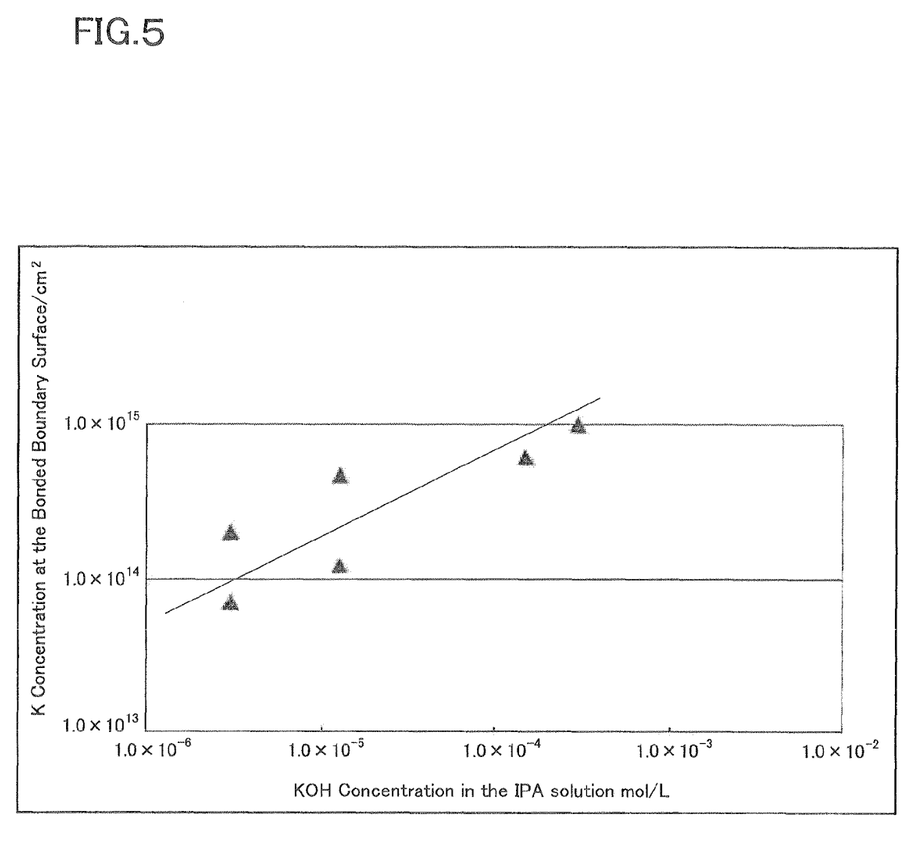
FIG. 5 is a graph showing a relationship of the K concentration in the organic solvent including alkali and the K concentration of the bonded boundary surface.

Referring to the results on FIG. 5, light emitting device samples having variously adjusted K concentrations on the bonding surface were prepared, and the forward voltages Vf just after starting conduction by 20 mA conduction, and having this as an initial value, and the decrease values of the forward voltage Vf decreased by continuous conduction to a stable value, that was stabilization voltage drop ΔVf, were respectively measured (Each sample number is 5). The above results are shown with graphs plotted to the K concentrations on the bonding surface in FIG. 6 (ΔVf), and FIG. 7 (Vf).

Figure 6:
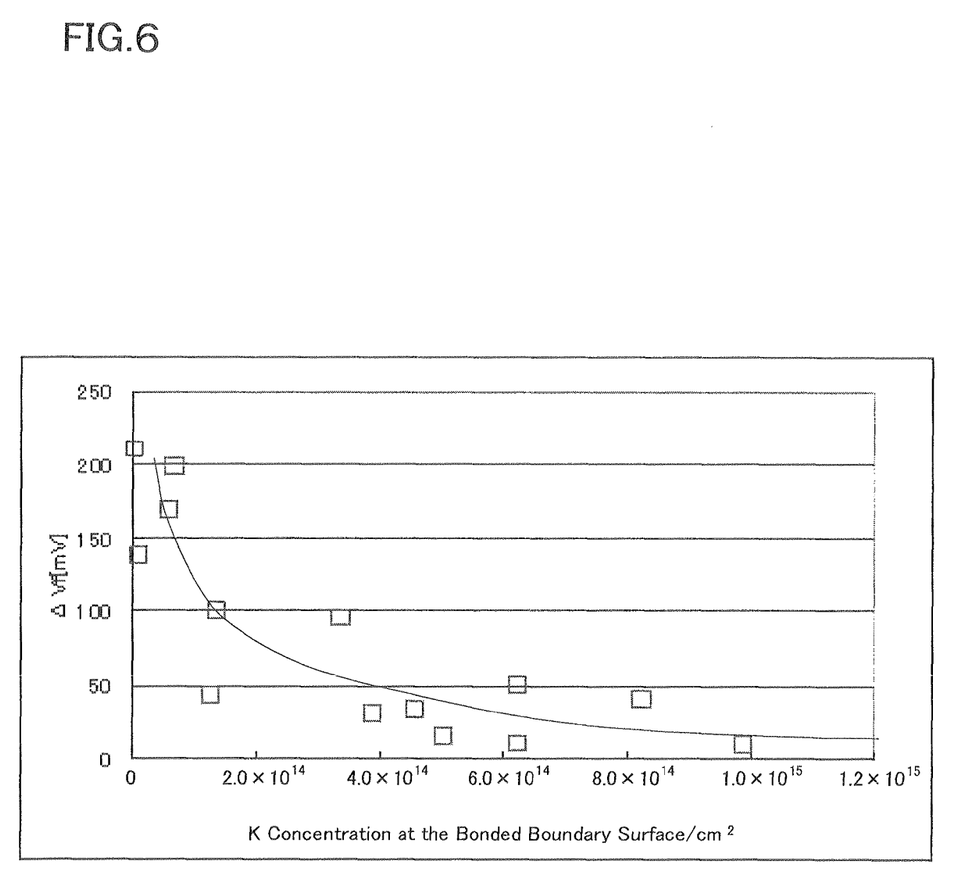
FIG. 6 is a graph showing a relationship of the K concentration of the bonded boundary surface and $\Delta Vf$.
Figure 7:
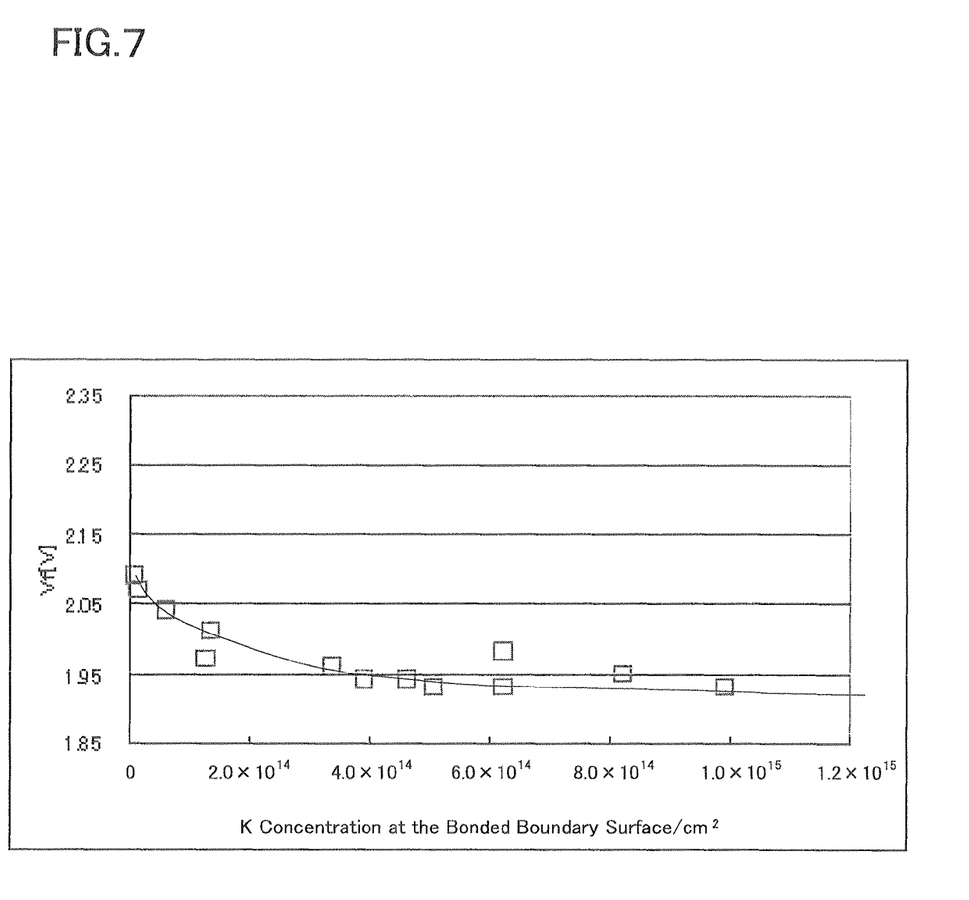
FIG. 7 is a graph showing a relationship of the K concentration of the bonded boundary surface and Vf.

According to the results, it's shown that when the K concentration on the boding surface is equal to or greater than $1\times10^{14}$ atoms/cm$^2$ (especially when equal to or greater than $3\times10^{14}$ atoms/cm$^2$), the ΔVf and Vf values are significantly small, and the excellent results are obtained. On the other hand, it is shown that when the K concentration on the bonding surface is less than $1\times10^{14}$ atoms/cm$^2$, the ΔVf and Vf significantly increases, and the variation is large.

For example, when using organic solvent adjusted by preparing a solution having potassium hydroxide dissolved at 22 mass % in water, further diluting it with water at 1:750 ratio, then adding isopropanol so as to have the potassium hydroxide concentration of $1.486\times10^{-4}$ mol/L, the K concentration on the bonding surface was $6.24\times10^{14}$/cm$^2$. Then, when measuring the Vf and ΔVf, they were respectively 1.98 to 1.99V and 20 to 50 mV, which were excellent Vf/ΔVf properties obtained. Also, when using organic solvent adjusted to have the potassium hydroxide concentration of $2.983\times10^{-4}$ mol/L, the K concentration on the bonding surface was $9.90\times10^{14}$/cm$^2$. Then, when measuring the Vf and ΔVf, they were respectively 1.92 to 1.93V and 0 (the lower measurable limit) to 10 mV, which were excellent Vf/ΔVf properties obtained. Also, even when applying annealing at a high temperature for long time, it was recognized that the boundary surface metal such as K does not migrate by SIMS measurement, and it was also recognized that even after long conduction, there were no influence to its properties except the Vf and ΔVf.

On the other hand, when using organic solvent adjusted to have the potassium hydroxide concentration of $3\times10^{-6}$ mol/L, the K concentration on the bonding surface was $7.16\times10^{13}$/cm$^2$. Additionally, when measuring the Vf and ΔVf, they were respectively 2.05 V and 180 to 220 mV, which were only insufficient values obtained.

What is claimed is:

1. A light emitting device, comprising a configuration having a transparent conductive semiconductor substrate directly bonded on one of main surfaces on a main compound semiconductor layer composed of Group III-V compound semiconductor, wherein an alkali metal atom concentration on a bonded boundary surface between the main compound semiconductor layer and the transparent conductive semiconductor substrate is adjusted to be equal to or greater than $1\times10^{14}$ atoms/cm$^2$ and equal to or less than $2\times10^{15}$ atoms/cm$^2$; and
    wherein the alkali metal atoms are either ones of potassium atoms and sodium atoms.

2. The light emitting device as claimed in claim 1, wherein thickness of an oxide film formed on the bonded boundary surface is equal to or less than 1.3 nm.

* * * * *